United States Patent [19]

Klima

[11] Patent Number: 4,530,734
[45] Date of Patent: Jul. 23, 1985

[54] LOW ENERGY ION ETCHING

[76] Inventor: Walter F. Klima, 59 Chestnut Hill La. S., Williamsville, N.Y. 14221

[21] Appl. No.: 458,460

[22] Filed: Jan. 17, 1983

[51] Int. Cl.³ .......................... B44C 1/22; C03C 15/00
[52] U.S. Cl. .................................... 156/628; 156/643; 156/654; 250/492.3
[58] Field of Search ............... 156/628, 643, 654, 657; 250/492.1, 492.2, 492.3, 499, 503.1, 518.1; 252/79.3

[56] References Cited

U.S. PATENT DOCUMENTS 3,303,085 2/1967 Price et al. ...................... 156/644 X
3,612,871 10/1971 Crawford et al. ............... 156/643 X Primary Examiner—William A. Powell
Attorney, Agent, or Firm—Albert F. Kronman

[57] ABSTRACT

A substrate is irradiated in a pattern with a neutron beam at energy levels well below those which produce either atomic reactions or physical disruption of the substrate structure. When etched with a suitable etchant, the irradiated portions are preferentially etched to produce a pattern corresponding to the irradiated pattern. In one embodiment of the invention, aluminosilicate crystals are irradiated with neutrons and are etched with hydrofluoric acid to produce the etched structure.

6 Claims, 3 Drawing Figures

LOW ENERGY ION ETCHING

BACKGROUND OF THE INVENTION

The present invention relates to etching and, more particularly, to etching of patterns in surfaces of materials.

In the production of semiconductor devices, for example, it is desirable to etch patterns in the surface of a substrate for producing electronic circuits and the like. One way of performing this in the prior art includes applying a photo resist to the surface and then exposing the surface to light through a mask so that a difference in solubility exists in the photo resist dependent upon whether or not a particular area was exposed to the light. In a subsequent step in the process, one of the differently exposed areas of resist is dissolved to produce a pattern corresponding to the photographic mask. Various further processing steps may be performed.

In integrated circuit manufacture, the density of circuits on a substrate is limited principally by the fineness of features which can be photographically reproduced. In commercial production of integrated circuits, line widths on the order of 3 to 5 microns are achieved. With the use of visible light, it is predicted that a line width of about 0.5 microns may be possible. With shorter wavelengths using, for example X-rays, slightly reduced line widths may be feasible. The theoretical limit on line widths appears to be the wavelength of the irradiation.

Etching using charged particles, such as electrons, disclosed in U.S. Pat. No. 3,615,935 and ions, as disclosed in U.S. Pat. Nos. 4,233,109 and 4,275,286 has limited resolution due to the net electrical charge on these particles which produces Coulomb repulsion mutually between particles and also between particles and the nuclei or electrons of the substrate. The interaction between the charged particles and the substrate, of course, also limits the depth of penetration into the substrate which can be expected when etching with charged particles.

High energy ion bombardment of a substrate which results in chemical alteration of the substrate through nuclear reactions is disclosed in U.S. Pat. Nos. 3,425,111 and 3,967,982. The latter patent also discloses that such high energy ion bombardment produces crystal dislocations, lattice defects and other damage, which must be eliminated by annealing or subsequent heat treatment in the processing.

A further use of neutron bombardment in semiconductor processing is disclosed in U.S. Pat. No. 3,733,222 in which such neutron bombardment is employed to eliminate the inversion layer in a diode between a masking layer and a P-type semi-conductor. This patent has no relationship to etching or the creation of patterns in a substrate, but is a post-formation treatment to improve the performance of the device.

OBJECTS AND SUMMARY OF THE INVENTION

It is an object of the invention to provide apparatus and method for producing an etched substrate which overcomes the drawbacks of the prior art.

It is a further object of the invention to provide means and method for tracing patterns onto substrate surfaces employing uncharged particles to modify the energy level of selected portions of the substrate whereby the modified portions can be enhanced using etchants or other methods of treatment.

It is a further object of the invention to provide means and apparatus for irradiating selected portions of a substrate with neutrons having sufficient energy levels to create lattice dislocations or nucleation centers which make the irradiated portions highly susceptible to etchants or other treatments.

It is a further object of the invention to treat a Muscovite or synthetic mica substrate with a neutron beam whereby treated portions of the substrate are made preferentially etchable by an etching agent.

It is a further object of the invention to provide means and method for etching a pattern in a substrate which has previously been patterned by neutron irradiation in which the time of neutron irradiation is uncritical.

According to an aspect of the invention, there is provided a method for producing an etched pattern comprising selecting a substrate which is very sensitive to irradiation by a neutron flux, whereby dislocations or highly energetic centers are formed on the irradiated surfaces, controlling the neutron flux to produce substantially only nucleation centers and not substantial atomic or nuclear reactions, and enhancing the irradiated pattern such as by etching the substrate with an etchant having a concentration and a temperature and for a time effective to cut the pattern to the prescribed limits.

According to a feature of the invention, there is provided a method for producing a concentrated neutron beam of variable energies which can be directed to irradiate the surface of a substrate, such as Muscovite or synthetic mica, and the substrate can be precisely displaced under the neutron beam to trace out any pattern on the substrate surface, the irradiated portions are energetically stimulated such that additional treatment further defines the pattern.

A substrate etched by a method comprising selecting a substrate (Muscovite or synthetic mica) which is made preferentially etchable by an etchant (hydrofluoric acid) after irradiation by a neutron flux, irradiating the substrate with a neutron flux in the pattern, controlling the neutron flux to a value below that at either substantial atomic reaction or physical damage is produced, and etching the substrate in the etchant having a concentration and a temperature and for a time effective to etch the pattern in the substrate.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

The present invention may be employed for any process which requires precise etching of a pattern into a substrate. One of the uses contemplated for the present invention includes etching of patterns into a substrate used for integrated circuits. When the term substrate is employed, this may mean a wafer of material or a wafer of material coated with one or more layers of material.

Figure 1:
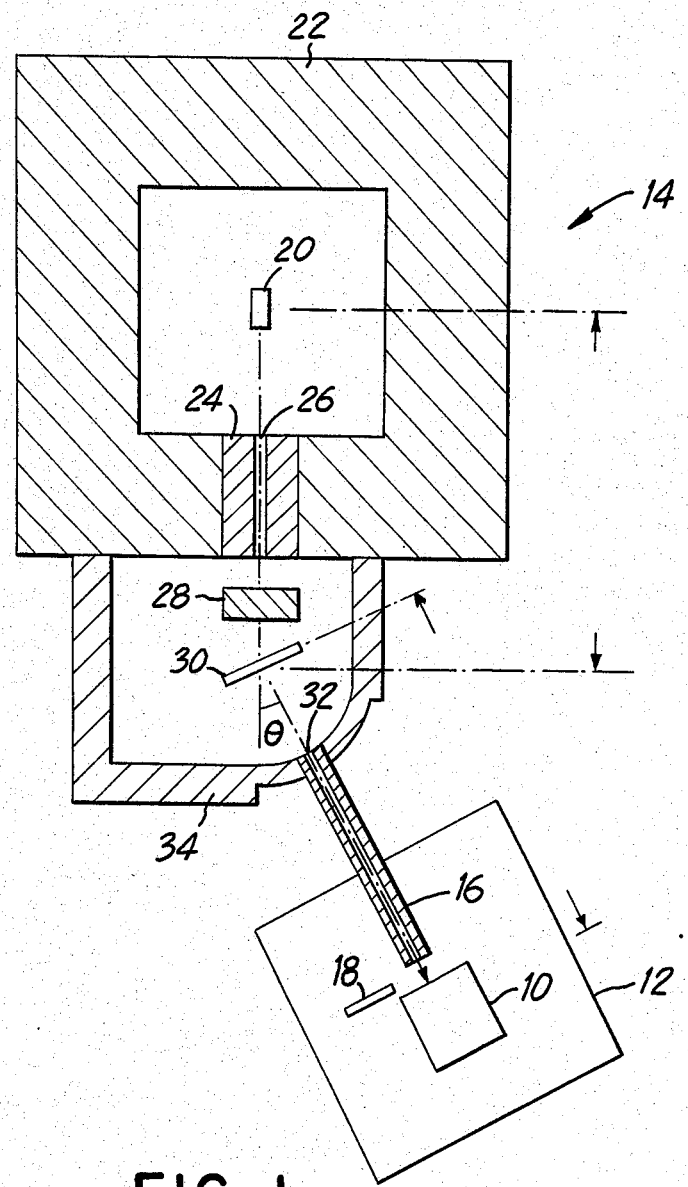
FIG. 1 is a schematic cross sectional diagram of a device for producing patterns in a substrate according to an embodiment of the present invention.

Referring now to FIG. 1, a substrate 10 of any suitable material which is preferentially etchable by a suitable etchant in areas irradiated by a low energy neutron beam is disposed on a movable table 12. In the preferred embodiment, substrate 10 may be Muscovite ($KH_2Al_2(SiO_4)$) or synthetic mica having a chemical composition of from about 10 to about 65 percent aluminum and from about 20 to about 80 percent silicon, with various impurities.

A neutron source, shown generally at 14, which may be any type of neutron source including a reactor or a quantity of radioactive material provides a narrow beam of neutrons through a radial arm 16 which impact on substrate 10. The neutron beam has a flux well below the value at which significant atomic reaction is produced in substrate 10. Instead, as the neutrons penetrate substrate 10, they activate the lattice atoms in a fashion which makes the portions of the substrate which have been irradiated more sensitive to dissolution by a suitable etchant than is the surrounding region. Possible reasons for the increased etch sensitivity of the irradiated regions include the possibility that the lattice atoms in substrate 10 are charged thus becoming energetically disfavored in the surrounding lattice structure and elevating them to a higher energy state which makes them more susceptible to etching. A further possible mechanism includes the transfer of kinetic energy from the neutrons to lattice atoms thus placing the lattice atoms in a higher energy state. A further possible mechanism includes localized thermal energy production sufficient to change the energy level of the lattice atoms. In any case, the incident ions are not employed to supply energy for dislocation formation on the substrate nor is there a nuclear reaction in which the chemical identity of the atoms are changed. Both of these processes require higher and more lengthy neutron fluxes than does the present invention. The present invention does not contemplate lattice atom displacement, but instead, contemplates keeping the slightly energized atoms in their original locations.

A shut valve 18 having a high stopping power for neutrons in barns, is provided for intercepting the neutron beam from radial arm 16.

Movable table 12 is a conventional movable table which may be precisely controlled in at least two orthogonal directions preferably under computer control. Any point on substrate 10 can thus be impacted by the ion beam emerging from radial arm 16. Shut valve 18 is effective to shut off the neutron beam when desired. Speed of motion of movable table 12 as well as the neutron flux determines the neutron density at any point on substrate 10.

For completeness of description, neutron source 14 is assumed to include a mass of fissionable material 20 enclosed in a heavy shielding container 22. Fissionable material 20 may be of any convenient type, however, Californium 252 is employed in the preferred embodiment due to its availability, high neutron yield, compactness and low heat dissipation. Californium is a synthetic material of atomic weight 98 which is created by bombarding Curium 242 with alpha particles to produce Californium 252. The small size of a mass of fissionable material 20 using Californium provides a small intense neutron source whose radiation dosages can be localized more efficiently than is possible with larger sources or with reactor or accelerator-generated radiation.

A collimator 24 set into shielding container 22 includes a passage 26 through which a narrow beam of neutrons is permitted to pass. Collimator 24 may employ a series of slits and diaphragms (not shown) of, for example, cadmium to reduce stray neutrons and to help concentrate the beam. The neutron beam passes through a moderator 28 which is effective to slow down, and thus reduce the energy in, the neutron beam which then passes through a monochromator 30 which may be, for example, a crystal of an appropriate material such as, for example, calcium fluoride or a magnetic field generator.

A calcium fluoride crystal, used in monochromator 28, has its atoms disposed in a matrix such that crystallographic planes are formed therein effective to reflect incident neutrons at angles corresponding to the speed or energy of the incident neutrons. Thus neutrons emerging at an angle $\theta$ from monochromator 28 all have substantially the same speed or energy.

Although neutrons have no net charge, they do possess a magnetic moment advantage of which may be taken to perform speed or energy sorting. Magnetized surfaces of ferromagnetic material or a properly oriented magnetic field can be employed as a neutron mirror in monochromator 28 which acts similarly to the crystallographic planes in a calcium fluoride crystal to sort the incident neutrons on the basis of speed or energy. The use of a magnetic field offers the further advantage that the magnetic field can function similarly to a lens for focussing the emerging neutron beam. Furthermore, varying the magnetic field can change the energy level of the emerging neutron beam and/or direct the path of the neutrons in their flight toward substrate 10.

Radial arm 16 is positioned with its channel 32 at angle $\theta$ to conduct selected neutrons to substrate 10. A shield 34 blocks unselected neutrons.

Once a desired pattern is traced out on substrate 10 by moving it under the neutron beam from radial arm 16, the irradiated regions of properly selected substrate material are more sensitive to etching by an etchant such as, for example, hydrofluoric acid. Substrate 10 is removed from movable table 12 and is etched in such an etchant wherein the temperature, agitation and the time are controlled to provide the desired depth of etched feature.

Figure 2:
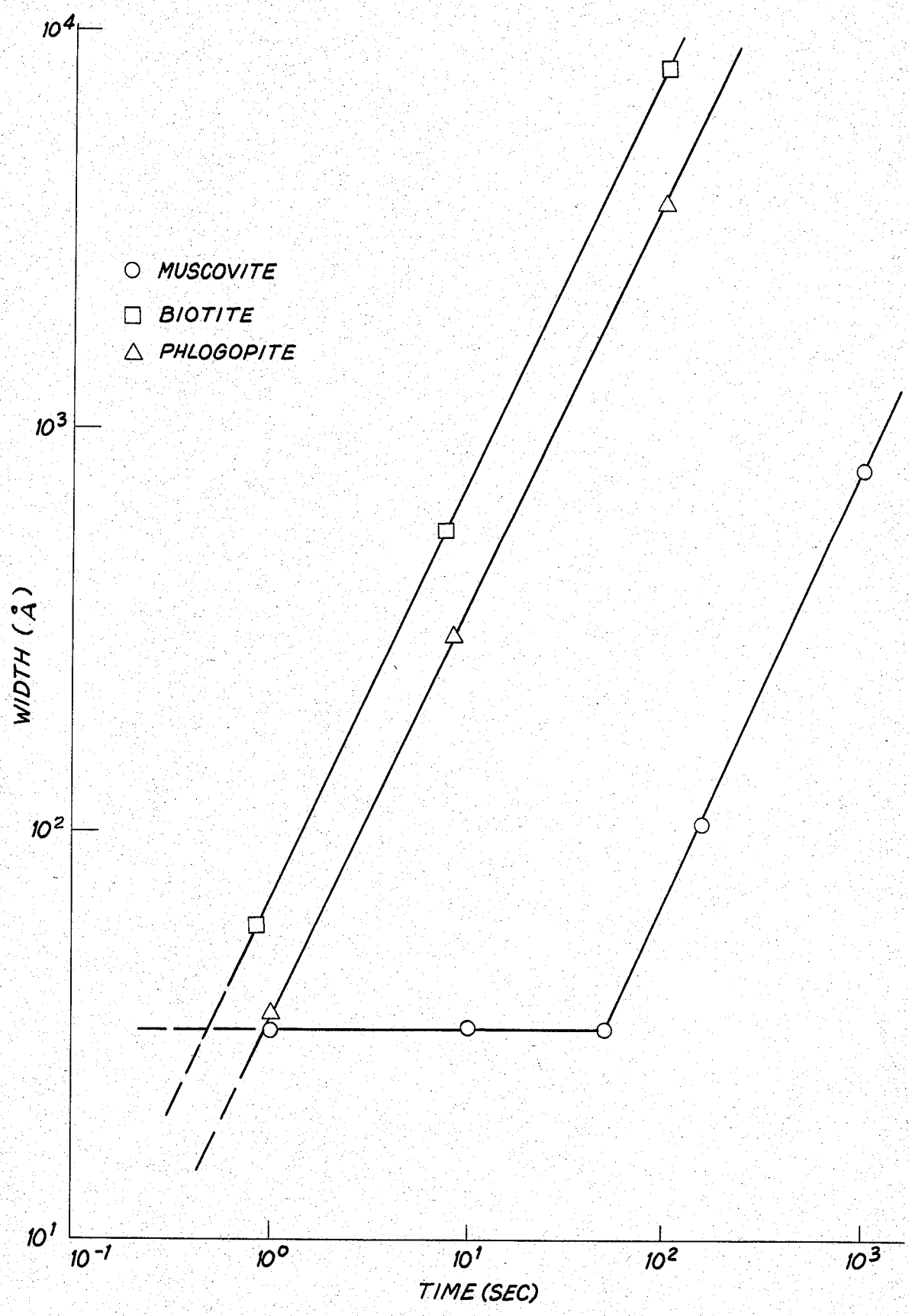
FIG. 2 is a graph relating the line width to irradiation time.

Referring now to FIG. 2, the benefit of using a properly selected substrate for the achievement of small line widths is shown. A curve 36 relates the width of a line after etching with hydrofluoric acid to the length of time that the line is irradiated. It is of interest to note that the initial portion of curve 36 is generally horizontal indicating that, after a very short period of irradiation, the post-etching line width does not increase with increasing irradiation until after a substantial additional irradiation period. As shown, the etched line width resulting from irradiation of less than one second is substantially the same as the line width produced by irradiation for about 80 seconds. After about 80 seconds, the etched line width increases with irradiation. In contrast, two other typical substrate materials, namely biotite and phlogopite exhibit constantly increasing line widths with increasing irradiation time. This feature of Muscovite simplifies the irradiation pattern production since the exact time of irradiation is not critical but, instead, provides a tolerance of two orders of magnitude in radiation time without substantial degradation in resolution.

Figure 3:
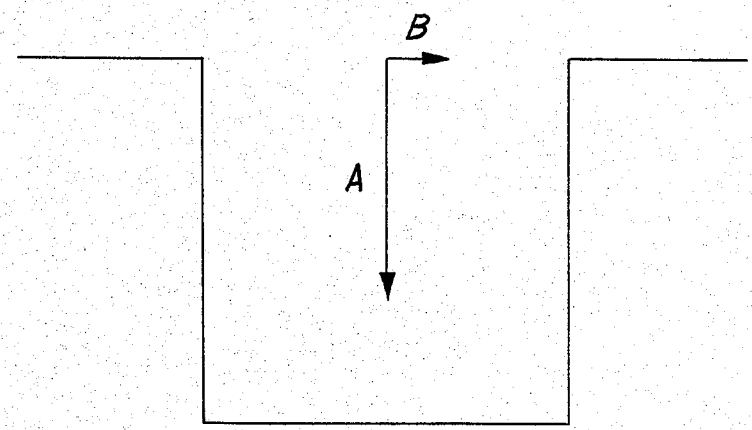
FIG. 3 is a cross section illustrating the depth to width relationship in an etched line.

A further benefit of proper selection of substrate is illustrated in FIG. 3 wherein the line depth is shown at A and line width is shown at B. In Muscovite, line width B can be on the order of 30 Angstroms ($10^{-10}$ meters) and line depth A on the order of 12 microns ($10^{-6}$ meters). There is, therefore, an aspect ratio, or ratio of depth to width, of about 4 orders of magnitude. Such large aspect ratio is valuable for producing precise pattern detail.

As previously noted, the pattern may be employed either for enabling etching in a basic substrate or in a resist mask of appropriate material which protects portions of the underlying substrate during further processing which may include, for example, etching, metalization, etc.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

I claim:

1. A method for producing an etched pattern comprising:
    selecting a substrate which is made preferentially etchable by an etchant after irradiation by a neutron flux;
    irradiating said substrate with a neutron flux in said pattern;
    controlling said neutron flux to a value below that at which either substantial atomic reaction or physical damage is produced; and
    etching said substrate in said etchant having a concentration and a temperature and for a time effective to etch said pattern in said substrate.

2. A method according to claim 1, wherein the step of selecting a substrate includes selecting a synthetic mica having from about 10 to about 65 percent aluminum and from about 20 to about 80 percent silicon.

3. A method according to claim 1, wherein the step of selecting a substrate includes selecting a muscovite substrate having a formula $KH_2Al_2(SiO_4)$.

4. A method according to claim 1, wherein the step of irradiating said substrate with a neutron flux in said pattern includes moving said substrate to present portions of a surface thereof to said neutron flux whereby said pattern is traced out on said surface.

5. A method according to claim 1, wherein the step of etching includes etching with a hydrofluoric acid.

6. A method for producing an etched pattern comprising:
    producing a substantially monochromatic neutron beam;
    irradiating a surface of a substrate consisting of one of muscovite or synthetic mica with said neutron beam;
    moving one of said substrate and said neutron beam during the step of irradiating whereby said pattern is traced out on said surface;
    controlling a flux of said neutron beam to a value below that which causes substantial atomic reaction or physical damage to said substrate; and
    etching said substrate with hydrofluoric acid whereby said pattern is etched into said surface.

* * * * *